(12) United States Patent
Gareau et al.

(10) Patent No.: US 10,440,811 B2
(45) Date of Patent: Oct. 8, 2019

(54) ACTIVE HEATSINK LID

(71) Applicant: Ciena Corporation, Hanover, MD (US)

(72) Inventors: Sebastien Gareau, Ottawa (CA); Marc Leclair, Gatineau (CA); Hugues Tournier, Gatineau (CA)

(73) Assignee: Ciena Corporation, Hanover, MD (US)

(*) Notice: Subject to any disclaimer, the term of this patent is extended or adjusted under 35 U.S.C. 154(b) by 215 days.

(21) Appl. No.: 15/199,788

(22) Filed: Jun. 30, 2016

(65) Prior Publication Data
US 2018/0007776 A1      Jan. 4, 2018

(51) Int. Cl.
| | |
|---|---|
| *H05K 1/02* | (2006.01) |
| *H01L 23/498* | (2006.01) |
| *H05K 1/14* | (2006.01) |
| *H05K 1/18* | (2006.01) |
| *H05K 3/34* | (2006.01) |
| *H01L 25/07* | (2006.01) |
| *H01L 23/367* | (2006.01) |
| *H01L 23/13* | (2006.01) |

(52) U.S. Cl.
CPC ......... *H05K 1/0203* (2013.01); *H01L 23/367* (2013.01); *H01L 23/49833* (2013.01); *H01L 25/072* (2013.01); *H05K 1/144* (2013.01); *H05K 1/181* (2013.01); *H05K 3/3436* (2013.01); *H01L 23/13* (2013.01); *H01L 23/3672* (2013.01); *H01L 23/49811* (2013.01); *H01L 23/49816* (2013.01); *H05K 2201/042* (2013.01); *H05K 2201/066* (2013.01); *H05K 2201/1031* (2013.01); *H05K 2201/10734* (2013.01)

(58) Field of Classification Search
CPC ...... H05K 1/0203; H05K 1/144; H05K 1/181; H05K 3/34; H01L 23/053; H01L 23/3672; H01L 23/3675; H01L 23/49883; H01L 25/0655; H01L 25/18
See application file for complete search history.

(56) References Cited

U.S. PATENT DOCUMENTS

| | | | | |
|---|---|---|---|---|
| 7,719,850 B2* | 5/2010 | Duerbaum | ............. | H05K 1/141 361/760 |
| 9,204,548 B2* | 12/2015 | Ahmad | ................. | H05K 1/141 |
| 2006/0227510 A1* | 10/2006 | Fitzgerald | ............... | H01L 23/04 361/704 |
| 2016/0150631 A1* | 5/2016 | Matsumoto | .......... | H05K 1/0204 361/720 |

* cited by examiner

*Primary Examiner* — James Wu
*Assistant Examiner* — Hung Q Dang
(74) *Attorney, Agent, or Firm* — Clements Bernard Walker PLLC; Christopher L. Bernard; Lawrence A. Baratta, Jr.

(57) ABSTRACT

An active device lid for a device base. The device lid includes a heatsink proximate to a circuit assembly and configured to remove heat generated by the device base, the circuit assembly configured to generate an operating signal voltage for the device base, and a connector configured to connect the circuit assembly to the device base, where the device base is configured to connect to a device mounting substrate on a substrate side of the device base, and where the circuit assembly is configured to be at least partially located on an opposing side of the device base, the opposing side opposing the substrate side.

17 Claims, 4 Drawing Sheets

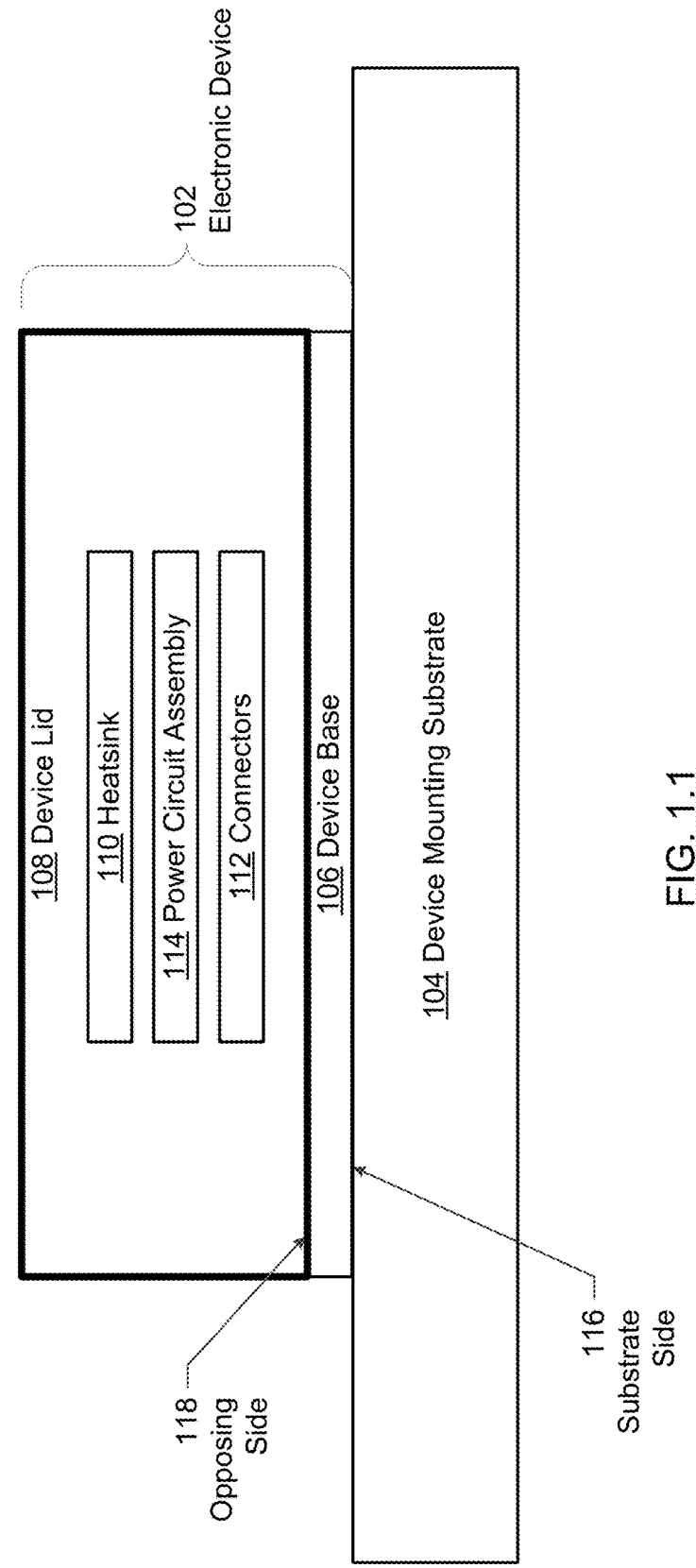
FIG. 1.1

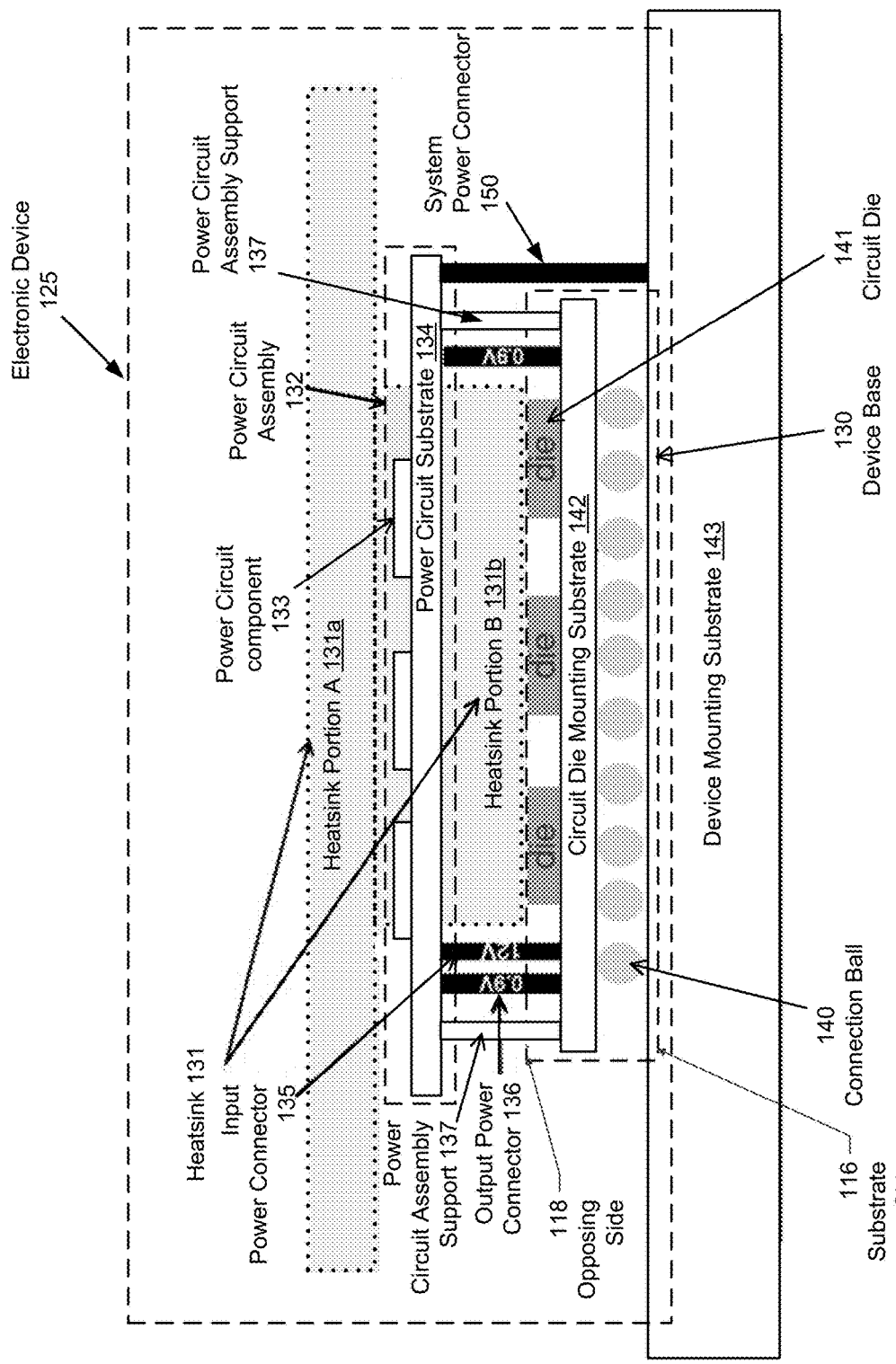
FIG. 1.2

ACTIVE HEATSINK LID

BACKGROUND

As semiconductor process geometries become smaller and electronic device supply voltages become lower, the operating power supply currents of electronic devices such as the application specific integrated circuit (ASIC), field programmable gate array (FPGA), application specific standard product (ASSP), etc. are ever increasing. For example, an electronic device with 70 W power dissipation and fabricated using 28 nm (nano-meter) semiconductor process geometry may receive 70 A operating current from an operating power supply voltage of approximately 1 V. In another example, an electronic device fabricated using 7 nm semiconductor process geometry may receive over 200 A operating current from an operating power supply voltage that is less than 1 V resulting in 100 W-150 W power dissipation. As a result, the area occupied by power circuits on a printed circuit board (PCB) is becoming larger. For example, the PCB area dedicated to the associated power circuit around the electronic device may be similar or even exceed the area of the electronic device. In addition, a larger number of connection pins/balls on the electronic device package are dedicated to the power circuit.

SUMMARY

In general, in one aspect, the invention relates to a device lid for a device base. The device lid includes a heatsink proximate to a circuit assembly and configured to remove heat generated by the device base, the circuit assembly configured to generate an operating signal voltage for the device base, and a connector configured to connect the circuit assembly to the device base, wherein the device base is configured to connect to a device mounting substrate on a substrate side of the device base, and wherein the circuit assembly is configured to be at least partially located on an opposing side of the device base, the opposing side opposing the substrate side.

In general, in one aspect, the invention relates to an electronic device. The electronic device includes a device base, and a device lid having a heatsink proximate to a circuit assembly and configured to remove heat generated by the device base, the circuit assembly configured to generate an operating signal voltage for the device base, and a connector configured to connect the circuit assembly to the device base, wherein the device base has a device mounting substrate on a substrate side of the device base, and wherein the circuit assembly is configured to be at least partially located on an opposing side of the device base, the opposing side opposing the substrate side.

In general, in one aspect, the invention relates to a method. The method includes installing a device base onto a device mounting substrate by connecting a substrate side of the device base onto the device mounting substrate, obtaining a device lid comprising a heatsink and a circuit assembly, and connecting the circuit assembly and the heatsink to the device base, wherein the circuit assembly is configured to be at least partially located on an opposing side of the device base, the opposing side opposing the substrate side.

Other aspects of the invention will be apparent from the following description and the appended claims.

BRIEF DESCRIPTION OF DRAWINGS

FIG. 1.1 shows a schematic diagram of an electronic device in accordance with one or more embodiments of the invention.

FIG. 1.2 shows an example diagram of an electronic device in accordance with one or more embodiments of the invention.

DETAILED DESCRIPTION

Figure 2:
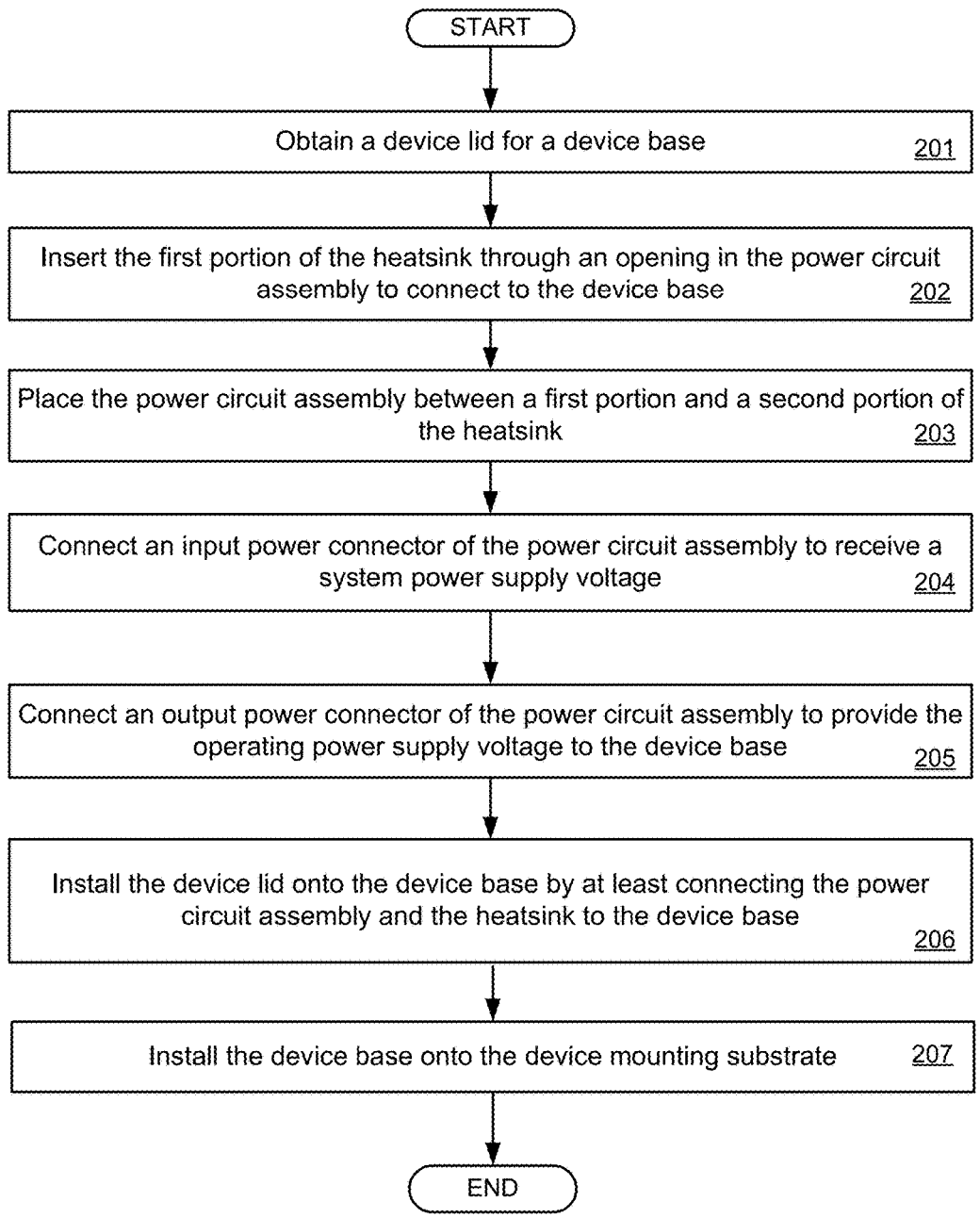
FIG. 2 shows a flowchart in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a device lid and a method to combine a circuit assembly and a heat sink of an electronic device into the device lid. In one or more embodiments of the invention, the circuit assembly is configured to generate an operating signal voltage for a device base. Specifically, the circuit assembly is separate from a device mounting substrate that mounts the electronic device. In one or more embodiments of the invention, the electronic device is formed by at least connecting the device lid with the circuit assembly and the heatsink to the device base for enclosing at least a topside of the device base.

FIG. 1.1 shows a diagram of a system in accordance with one or more embodiments of the invention. As shown in FIG. 1.1, the system includes an electronic device (102) on a device mounting substrate (104) in accordance with one or more embodiments of the invention.

In one or more embodiments, the device mounting substrate (104) is a printed circuit board (PCB). The device mounting substrate (104) physically supports and electrically connects electronic devices. The device mounting substrate may use conductive tracks, pads and other features created from conductive material on a non-conductive surface. For example, the device mounting substrate (104) may include connection traces embedded in a rigid piece of material, such as a PCB, a ceramic substrate, etc. In another example, the device mounting substrate (104) may include connection traces embedded in a flexible piece of material, such as a polyimide film, or other polymer based flexible film.

As shown in FIG. 1.1, an electronic device (102) may be installed on the device mounting substrate (104). The installation may be via mounting, affixing, or otherwise attaching the electronic device (102) to the device mounting substrate (104). The electronic device (102) includes a device base (106) and a device lid (108). In one or more embodiments, the device base (106) is manufactured separately from the device lid (108). For example, the device base (106) may be manufactured by a first manufacturer that is a different entity than the second manufacturer that manufactures the device lid (108). In one or more embodiments of the invention, the device base (106) may be installed temporally separately from the device lid (108).

In one or more embodiments of the invention, the device base (106) is an electronic component that includes the electronic logic to perform the functions of the electronic device (102). For example, the device base (106) may be or may include an integrated circuit, memory modules, or other hardware component. By way of more specific examples, the device base may be an input/output port, processing unit, memory, and other devices. In one or more embodiments, the device base (106) does not have a lid that is different from the device lid (108). In other words, the only lid for the device base (106) is the device lid (108).

As shown in FIG. 1.1, the device base (106) includes a substrate side (116) that is the side installed onto the device mounting substrate (104) and an opposing side (118), which is opposite of the substrate side installed onto the device mounting substrate (104). The opposing side (118) is parallel to the substrate side (116). The device lid (108) is substantially located on the opposing side (118). More particularly, at least fifty percent of the device is covered by the device lid (108) in one or more embodiments of the invention. By way of an example, the device lid (108) may cover the entire opposing side (118) or only a part of the opposing side (118). The device lid (108) may also cover the sides of the device base that are perpendicular to the device mounting substrate (104). In some embodiments, the device lid (108) may enclose or encase the device base (106) to mitigate physical damage, such as corrosion of the device base.

As shown in FIG. 1, the device lid (108) may include a heatsink (110), a power circuit assembly (114), and connectors (112) in accordance with one or more embodiments of the invention. Each of these components is described below.

The heatsink (110) is a heat exchanger that transfers the heat generated by the device base (106) to an ambient space surrounding the device. The heatsink (110) may be an active component or a passive component. For example, as an active component, the heatsink may use power to charge a fan. In at least some embodiments of the invention, the device lid does not include a heatsink.

The power circuit assembly (114) is a physical device that includes functionality to generate an operating power supply voltage from a system power supply. In other words, the system power voltage, or the voltage provided by a power supply on the PCB that powers multiple electronic devices, may be different than the voltage used by the device base (i.e., the operating power supply voltage). The power circuit assembly (114) may include functionality to provide the operating power supply voltage to the device base (106) from the system power supply voltage (not shown).

In one or more embodiments, the power circuit assembly (114) surrounds at least a portion of the heatsink (110). In other words, the power circuit assembly (114) may have an opening, which is penetrated by the heatsink (110). For example, the power circuit assembly (114) may be cylindrical, torus shaped, cube shape with a hole, or another shape, whereby the heatsink is in the middle of the power circuit assembly.

By including the power circuit assembly (114) in the device lid (108), one or more embodiments may minimize a footprint of the electronic device (102) on the device mounting substrate (108). In other words, the stacking the power circuit assembly on the electronic device (102) reduces the surface area required by the electronic device (102) on the device mounting substrate (108). Thus, larger device bases, smaller device mounting substrates, more electronic devices, or any combination thereof may be placed on the device mounting substrate in accordance with one or more embodiments of the invention.

Continuing with FIG. 1.1, one or more connectors (112) electrically connect the device lid to the device base (106). The connection may be direct or indirect. For example, the connection may be through the device mounting substrate (104) in accordance with one or more embodiments of the invention. For example, the connectors may be of the form of a conductive connection balls that transmit operating power supply voltages (referred to as power connections), and connection balls that transmit electrical signals (referred to as signal connections). Different forms of the connection balls exist for making the power and/or signal connections. For example, the connection ball may be a metal ball for electrical connection using a surface mounting technique. In another example, the connection ball may represent a metal pin for electrical connection using a through-hole mounting technique.

Although FIG. 1.1, shows a particular configuration of components, other configurations may be used without departing from the scope of the invention. For example, some components shown may not exist in some embodiments. Other components not shown may exist. For example, although not shown in FIG. 1.1, the electronic device (102) may include central power source that provides power to the power circuit assembly.

FIG. 1.2 shows an example diagram of an electronic device in accordance with one or more embodiments of the invention. As shown in FIG. 1.2, the electronic device (125) includes a device base (130), a power circuit assembly (132), and a heatsink (131). The device base (130) and the power circuit assembly (132) are electronically connected using power connectors such as the input power connector (135) and the output power connector (136). Further, the device base (130) and the power circuit assembly (132) are mechanically connected using the power circuit assembly support (137). In addition, the power circuit assembly (132) is shown connected to the device mounting substrate (143) via a system power connector (150).

In one or more embodiments of the invention, the device base (130) includes one or more circuit dice (e.g., circuit die (141)) mounted on a circuit die mounting substrate (142). Throughout this disclosure, the term "circuit die" refers to a single piece of semiconductor circuit without any detachable enclosure. In particular, any protective and/or passivation coating material enclosing the circuit die (e.g., circuit die (141)) becomes an integral part of the circuit die that is non-detachable. In other words, detaching any protective and/or passivation coating material enclosing the circuit die renders the circuit die substantially non-functional.

The circuit die mounting substrate (142) is connected to the device mounting substrate (143) via a number of connection balls (e.g., connection ball (140)) for making power connections and signal connections. For example, the connection ball (140) may be used to supply a system power supply voltage from the device mounting substrate (143) to the circuit die mounting substrate (142) and, in turn, to the circuit die (141) via a power connection trace on the circuit die mounting substrate (142). In another example, the connection ball (140) may be used to transmit an electrical signal from the device mounting substrate (143) to the circuit die mounting substrate (142) and, in turn, to the circuit die (141) via a signal connection trace on the circuit die mounting substrate (142).

The circuit die mounting substrate (142) provides mechanical support and electrical connection to the circuit die (141). For example, the circuit die mounting substrate (142) may include a piece of insulating material (e.g., ceramic, fiberglass, polyimide, etc.) plated with interconnection metal traces. In another example, the circuit die mounting substrate (142) may include an interposer that is an electrical interface routing between one connection pattern to a different connection pattern. In one or more embodiments, a mounting side of the circuit die (141) is in contact with the circuit die mounting substrate (142) to receive the mechanical support.

In one or more embodiments, a non-mounting side of the circuit die (141) (e.g., opposing side in FIG. 1.1) is in contact with the heatsink (131) to transfer the heat. For example, the heat may be carried away from the circuit die (141), or by free flowing or circulating fluids (e.g., air or liquid coolant) moving through the ambient space. The heatsink (131) may over-hang the electronic device (125) significantly due to the amount of power dissipation of the electronic device (125).

In one or more embodiments of the invention, the power circuit assembly (132) includes one or more power circuit components (e.g., power circuit component (133)) mounted on a power circuit substrate (134). In one or more embodiments, the power circuit substrate (134) is a piece of material providing mechanical support and electrical connection to the one or more power circuit components of the power circuit assembly (132). For example, the power circuit substrate (134) may include connection traces embedded in a rigid piece of material (e.g., a PCB, a ceramic substrate, etc.) and/or a flexible piece of material (e.g., a polyimide film, or other polymer based flexible film). In one or more embodiments, the power circuit component (133) is one of a number of circuit components (e.g., rectifier, diode, amplifier, capacitor, resistor, inductor, etc.) forming a power circuit. Specifically, the power circuit is an electronic circuit that generates the operating power supply voltage (e.g., 0.9 V) for the device base (130) or, in particular, the circuit die (141). For example, the circuit die (141) receives the operating power supply voltage (e.g., 0.9 V) from the power circuit on the power circuit substrate (134) via the output power connector (136) and a metal connection trace on the circuit die mounting substrate (142).

In one or more embodiments, the power circuit receives the system power supply voltage (e.g., 12 V) from the device mounting substrate (143) to generate the operating power supply voltage (e.g., 0.9 V). For example, the power circuit may receive the system power supply voltage (e.g., 12 V) indirectly from the device mounting substrate (143) via the input power connector (135), the circuit die mounting substrate (142), and the connection ball (140). In other words, the system power supply voltage (e.g., 12 V) is routed from the device mounting substrate (143) to the circuit die mounting substrate (142) via the connection ball (140), and in turn routed to the power circuit on the power circuit substrate (134) via the input power connector (135). In another example, the power circuit may receive the system power supply voltage (e.g., 12 V) directly from the device mounting substrate (143) via the alternative power connector (135a).

In one or more embodiments of the invention, the power circuit assembly (132) is connected to the circuit die mounting substrate (142) using the power circuit assembly support (137), which provide mechanical support to the power circuit assembly (132). For example, the power circuit assembly support (137) may include one or more posts or fences that are attached (e.g., using a screw or snap-fit mechanism) to both the power circuit assembly (132) and the circuit die mounting substrate (142). A post is a one-dimensional piece, such as a rod. A fence is a two-dimensional piece, e.g., having a rectangular shape.

In one or more embodiments of the invention, the heatsink (131) is disposed proximate to the power circuit assembly (132). In one or more embodiments, the heatsink (131) and the power circuit assembly (132) collectively enclose at least a topside of the device base (130) and are collectively referred to as an active lid. As used herein, the active lid refers to a device lid having active circuitry, such as the aforementioned power circuit. As shown in FIG. 1.1, the heatsink (131) is in contact with the circuit die (141) to remove the heat generated by the circuit die (141). For example, the circuit die (141) receives the operating power supply voltage (e.g., 0.9 V) to perform various functions of the circuit die (141) while the heat is generated as a by-product.

Figure 3:
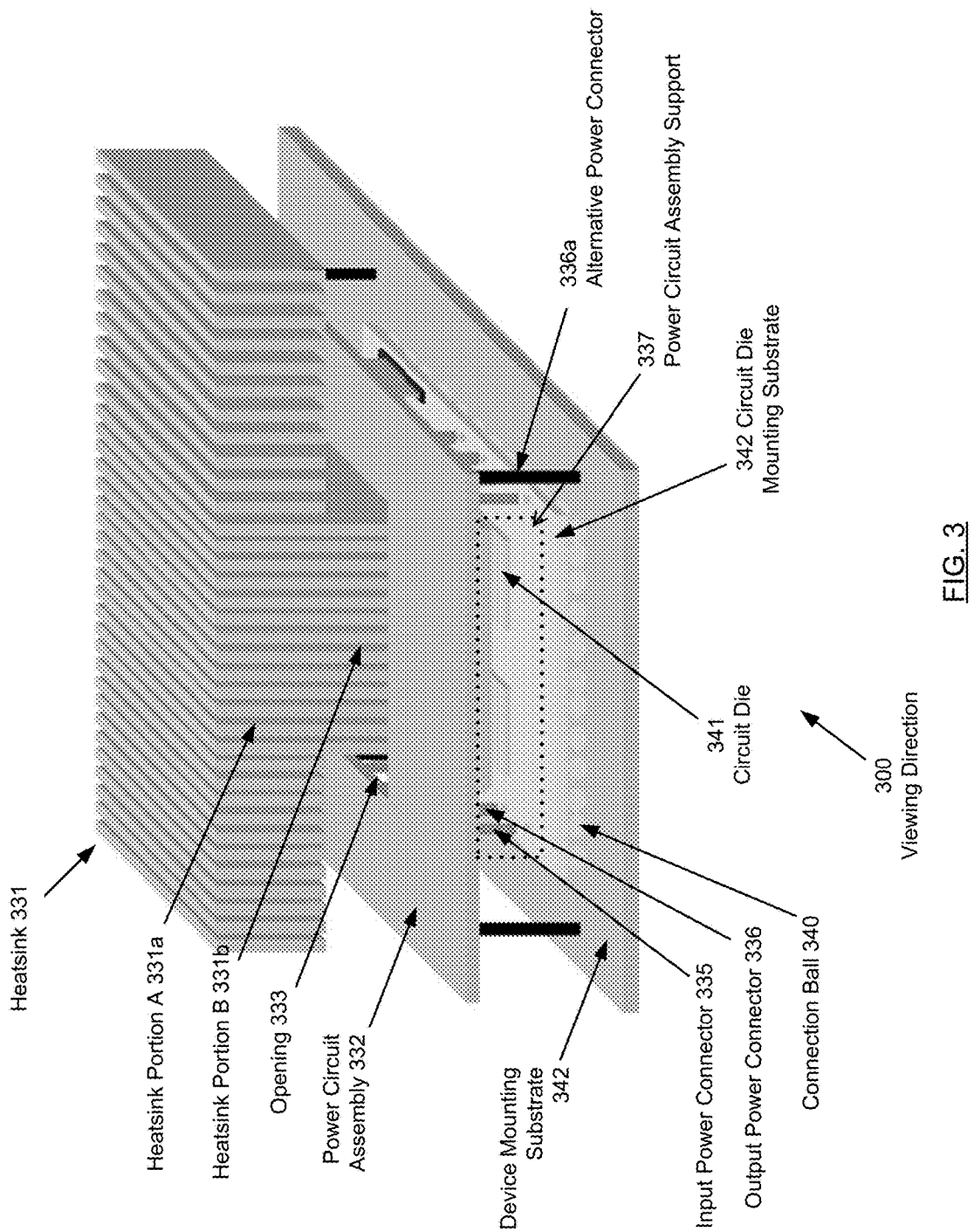
FIG. 3 shows an example in accordance with one or more embodiments of the invention.

In one or more embodiments, the heatsink (131) includes a heatsink portion A (131a) for releasing the heat into an ambient space and a heatsink portion B (131b) for collecting the heat from the device base (130). Further, the power circuit assembly (132) is disposed between the heatsink portion A (131a) and the heatsink portion B (131b). In one or more embodiments, the heatsink (131) penetrates an opening in the power circuit assembly (132) to connect to the device base (130). For example, the opening may be a hole enclosed on all four sides by the power circuit assembly (132). In another example, the opening may be an open-ended hole partially enclosed by the power circuit assembly (132). An example of the active lid with the heatsink (131) penetrating an opening in the power circuit assembly (132) to connect to the device base (130) is shown in FIG. 3 below.

FIG. 2 shows a flowchart (200) in accordance with one or more embodiments. The process depicted in FIG. 2 may be used to design, manufacture, and/or assemble a device lid and/or an electronic device enclosed using an active lid. The process shown in FIG. 2 may be performed based on the device lid and/or associated electronic device discussed above in reference to FIG. 1B. One or more steps shown in FIG. 2 may be omitted, repeated, and/or performed in a different order among different embodiments of the invention. Accordingly, embodiments of the invention should not be considered limited to the specific number and arrangement of steps shown in FIG. 2.

Initially, in Step 201, a device lid is obtained for a device base. In one or more embodiments of the invention, a power circuit assembly is configured, for including in the device lid, as a separate piece from a device mounting substrate (i.e., the substrate for mounting the device base). In particular, the power circuit assembly is configured to generate an operating power supply voltage for the device base. Further, a heatsink is configured for including in the device lid in a proximate position to the power circuit assembly. In particular, the heatsink is configured to remove heat generated by the device base, in particular by one or more circuit dice of the device base. In one or more embodiments, the power circuit assembly and the heatsink are provided as two separate pieces that are assembled into the device lid in a subsequent process.

In Step 202, the heatsink is inserted through an opening in the power circuit assembly. In one or more embodiments of the invention, the heatsink includes a first portion and a second portion. The first portion of the heatsink is inserted through the opening and is used for making thermal contact with one or more circuit dice of the device base. The second portion of the heatsink is used to release the heat to an ambient space.

In Step 203, the power circuit assembly is placed between the first portion and the second portion of the heatsink to assemble the device lid. In one or more embodiments, the gap between the hole and the inserted heatsink is filled with a sealing material. For example, the sealing material may provide an air-tight fit and mechanically secure the heatsink to the power circuit assembly. In another example, the heatsink is secured to the power circuit assembly using other mechanisms such as a retaining clip, snap-fit, screw, or other retaining device. In one or more embodiments, upon securing the heatsink to the power circuit assembly, the heatsink and the power circuit assembly are assembled into a single piece device lid.

In Step 204, an input power connector of the power circuit assembly is connected to receive a system power supply voltage, which is used by the power circuit assembly to generate the operating power supply voltage. In one or more embodiments of the invention, the input power connector is connected directly to the device mounting substrate to receive the system power supply voltage. In one or more embodiments of the invention, the input power connector is connected indirectly to the device mounting substrate via the circuit die mounting substrate and one or more connection balls of the device base to receive the system power supply voltage. For example, the input power connector may be connected using a pin/socket connection, surface mounting connection, press-fit connection, or any other suitable connection.

In Step 205, an output power connector of the power circuit assembly is connected to provide the operating power supply voltage to the device base. In one or more embodiments of the invention, the output power connector is connected to the circuit die mounting substrate of the device base to provide the operating power supply voltage to one or more circuit dice of the device base. For example, the output power connector may be connected using a pin/socket connection, surface mounting connection, press-fit connection, or any other suitable connection.

In Step 206, the device lid is installed onto the device base by at least connecting the power circuit assembly and the heatsink to the device base. In one or more embodiments of the invention, the power circuit assembly, with the heatsink secured thereon, is connected to the circuit die mounting substrate of the device base using the power circuit assembly support. For example, the power circuit assembly support may be integrated with the power circuit assembly and is connected to the circuit die mounting substrate using a press-fit, snap-fit, soldering, gluing, or other types of connection. In one or more embodiments, the device lid encloses at least a topside of the device base.

In Step 207, the device base, connected with the device lid, is installed onto the device mounting substrate. In response to installing the device base, the device lid receives the system power supply voltage from the device mounting substrate and in turn generates/provides the operating power supply voltage to the device base. In one or more embodiments of the invention, the device lid is installed onto the device base prior to installing the device base onto the device mounting substrate. In one or more embodiments of the invention, the device lid is installed onto the device base subsequent to installing the device base onto the device mounting substrate. In one or more embodiments of the invention, the device lid is installed onto the device base and the device base is installed onto the device mounting substrate in a single integrated assembly process.

FIG. 3 shows an example in accordance with one or more embodiments of the invention. The example shown in FIG. 3 may be based on the schematic diagram and method flow chart discussed in reference to FIG. 1.2 and FIG. 2 above. In particular, the heatsink (331), heatsink portion A (331a), heatsink portion B (331b), power circuit assembly (332), device mounting substrate (342), input power connector (335), output power connector (336), connection ball (340), circuit die (341), circuit die mounting substrate (342), power circuit assembly support (337), and alternative input power connector (336a) depicted in FIG. 3 are examples of the like-named components depicted in FIG. 1.2 above. In one or more embodiments, one or more of the modules and elements shown in FIG. 3 may be omitted, repeated, and/or substituted. Accordingly, embodiments of the invention should not be considered limited to the specific arrangements of modules shown in FIG. 3.

FIG. 3 shows an example 3D view of the electronic device (125) depicted in FIG. 1.2 above. For example, the schematic diagram depicted in FIG. 1.2 of the electronic device (125) may correspond to a cross sectional view from the viewing direction (300) shown in FIG. 3.

As shown in FIG. 3, the heatsink (331) and the power circuit assembly (332) form an active lid that is attached to the circuit die mounting substrate (342) using the power circuit assembly support (337). In particular, the heatsink (331) penetrates an opening (333) in the power circuit assembly (332) to contact the circuit die (341). In this configuration, the power circuit assembly (332) is positioned in between the heatsink portion A (331a) and heatsink portion B (331b). The power circuit assembly (332) receives the system power supply voltage from the device mounting substrate (342) directly via the alternative power connector (336a) and/or indirectly via a combination of the input power connector (335) and the connection ball (340). Using the system power supply voltage, the power circuit assembly (332) generates the operating power supply voltage that is provided to the circuit die (341) via the output power connector (336).

Although the power circuit assembly support (337) is shown as a single rectangular shaped piece, other examples of the power circuit assembly support (337) may include multiple rectangular shaped pieces along one or more sides of the circuit die mounting substrate (342). For example, the power circuit assembly support (337) may include four adjoining rectangular shaped pieces along four sides of the circuit die mounting substrate (342) to form a fully enclosed fence. In addition, the opening (333) may be filled with a sealing material, such as a gasket to allow the circuit die (342) to be fully enclosed (i.e., sealed) by the active lid. In another example, the power circuit assembly support (337) may include multiple posts spread along four sides of the circuit die mounting substrate (342) to allow air flow across the surface of the circuit die mounting substrate (342) for ventilation.

The device lids, devices, and methods described above relate to combining a power circuit assembly and a heat sink into a device lid of an electronic device. Instead of or in addition to the power circuit assembly, another type of circuit assembly may be used. The circuit assembly may provide an additional or different type of electrical function than power. For example, various connections for power described above may be supplemented or substituted by data connections. In particular, data is transmitted as a signal via an operating signal voltage. The operating signal voltage and system signal voltage may be the operating power supply voltage and system power supply voltage described above, and/or transmit a data signal for a different type of circuit assembly.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus with a device lid for a device base comprising:
 a heatsink proximate to a circuit assembly and configured to remove heat generated by the device base;
 the circuit assembly configured to generate an operating power supply voltage for the device base; and
 a connector configured to connect the circuit assembly to the device base, wherein the heatsink, the circuit assembly, and the connector are formed in the device lid, wherein the device lid is separate from the device base, installed over the device base and provides protection of the device base,
 wherein the device base is an electronic component including one or more circuit die that includes electronic logic to perform functions of an electronic device,
 wherein the device base is configured to connect to a device mounting substrate including a Printed Circuit Board (PCB) on a substrate side of the device base,
 wherein the circuit assembly is configured to be at least located on a topside of the device base opposing the substrate side,
 an input connector between the PCB and the circuit assembly, wherein the input connector is configured to receive a system power supply voltage from the PCB, wherein the system power supply voltage is used by the circuit assembly to generate the operating power supply voltage, and wherein the system power supply voltage is routed from the PCB to the device base, and, in turn, routed to the circuit assembly via the input connector; and
 an output connector between the circuit assembly and the device base, wherein the output connector is configured to provide the operating power supply voltage to the one or more circuit die in the device base,
 wherein the input connector and the output connector are operatively coupled to the circuit assembly.

2. The apparatus of claim 1,
 wherein the heatsink comprises a first portion for collecting the heat from the device base and a second portion for releasing the heat into an ambient space,
 wherein the circuit assembly is interposed between the first portion and the second portion of the heatsink.

3. The apparatus of claim 2,
 wherein the heatsink penetrates an opening in the circuit assembly to connect to the device base.

4. The apparatus of claim 1,
 wherein the input connector is connectable to a circuit die mounting substrate on the device base for receiving the system power supply voltage from the device mounting substrate via at least one of a plurality of connection balls on the device base.

5. The apparatus of claim 1,
 wherein the input connector is connectable to the device mounting substrate for receiving the system power supply voltage.

6. The apparatus of claim 1,
 wherein the circuit assembly comprises a plurality of circuit components coupled to a circuit substrate.

7. An electronic device, comprising:
 a device base; and
 a device lid comprising:
  a heatsink proximate to a circuit assembly and configured to remove heat generated by the device base,
  the circuit assembly configured to generate an operating power supply voltage for the device base, and
  a connector configured to connect the circuit assembly to the device base, wherein the heatsink, the circuit assembly, and the connector are formed in the device lid, wherein the device lid is separate from the device base, installed over the device base and provides protection of the device base,
 wherein the device base is an electronic component including one or more circuit die that includes electronic logic to perform functions of the electronic device,
 wherein the device base has a device mounting substrate including a Printed Circuit Board (PCB) on a substrate side of the device base,
 wherein the circuit assembly is configured to be at least located on a topside of the device base opposing the substrate side,
 an input connector between the PCB and the circuit assembly, wherein the input connector is configured to receive a system power supply voltage from the PCB, wherein the system power supply voltage is used by the circuit assembly to generate the operating power supply voltage, and wherein the system power supply voltage is routed from the PCB to the device base, and, in turn, routed to the circuit assembly via the input connector; and
 an output connector between the circuit assembly and the device base, wherein the output connector is configured to provide the operating power supply voltage to the one or more circuit die in the device base,
 wherein the input connector and the output connector are operatively coupled to the circuit assembly.

8. The electronic device of claim 7,
 wherein the heatsink comprises a first portion for collecting the heat from the device base and a second portion for releasing the heat into an ambient space,
 wherein the circuit assembly is disposed between the first portion and the second portion of the heatsink.

9. The electronic device of claim 8,
 wherein the heatsink penetrates an opening in the circuit assembly to connect to the device base.

10. The electronic device of claim 7,
 wherein the device base comprises a circuit die, a circuit die mounting substrate, and a plurality of connection balls,
 wherein the circuit die comprises:
  a mounting side that is attached to a first side of the circuit die mounting substrate; and
  a non-mounting side that is connectable to the heatsink,
 wherein the plurality of connection balls are attached to a second side of the circuit die mounting substrate for connecting the device base to the device mounting substrate, and
 wherein the output connector is connectable to the circuit die mounting substrate for providing the operating power supply voltage to the circuit die.

11. The electronic device of claim 10,
 wherein the input connector is connectable to the circuit die mounting substrate for receiving the system power supply voltage from the device mounting substrate via at least one of the plurality of connection balls.

12. The electronic device of claim 10,
 wherein the input connector is connectable to the device mounting substrate for receiving the system power supply voltage.

13. A method, comprising:
installing a device base onto a device mounting substrate by connecting a substrate side of the device base onto the device mounting substrate including a Printed Circuit Board (PCB);
obtaining a device lid comprising a heatsink, a circuit assembly, and a connector, each formed in the device lid; and
connecting the circuit assembly and the heatsink to the device base via the connector, wherein the device lid is separate from the device base, installed over the device base and provides protection of the device base,
wherein the device base is an electronic component including one or more circuit die that includes electronic logic to perform functions of an electronic device,
wherein the circuit assembly is configured to be at least located on a topside of the device base opposing the substrate side, and
wherein the circuit assembly is configured to generate an operating power supply voltage for the device base,
wherein connecting the circuit assembly and the heatsink to the device base further comprises:
  connecting an input connector of the circuit assembly to receive a system power supply voltage, wherein the system power supply voltage is used by the circuit assembly to generate the operating power supply voltage, and wherein the system power supply voltage is routed from the PCB to the device base, and, in turn, routed to the circuit assembly via the input connector; and
  connecting an output connector of the circuit assembly to provide the operating power supply voltage to the device base, wherein the output connector is configured to provide the operating power supply voltage to the one or more circuit die in the device base,
    wherein the input connector and the output connector are operatively coupled to the circuit assembly.

14. The method of claim 13, wherein connecting the circuit assembly and the heatsink to the device base comprises:
  placing the circuit assembly between a first portion and a second portion of the heatsink, the method further comprising:
    using the first portion of the heats ink to collect the heat from the device base; and
    using the second portion of the heats ink to release the heat into an ambient space.

15. The method of claim 14, wherein connecting the circuit assembly and the heatsink to the device base further comprises:
  inserting the first portion of the heatsink through an opening in the circuit assembly to connect to the device base.

16. The method of claim 14,
wherein the device base comprises a circuit die, a circuit die mounting substrate, and a plurality of connection balls,
wherein the circuit die comprises:
  a mounting side that is attached to a first side of the circuit die mounting substrate; and
  a non-mounting side that is connectable to the heatsink,
wherein the plurality of connection balls are attached to a second side of the circuit die mounting substrate for connecting the device base to the device mounting substrate, and
wherein connecting the circuit assembly and the heatsink to the device base further comprises:
  connecting the output connector to the circuit die mounting substrate to provide the operating power supply voltage to the circuit die.

17. The method of claim 16, wherein connecting the circuit assembly and the heatsink to the device base further comprises:
  connecting the input connector to at least one selected from a group consisting of the circuit die mounting substrate and the device mounting substrate,
  wherein the method further comprises:
    attaching the device base onto the device mounting substrate; and
    receiving, by the circuit assembly, the system power supply voltage from the device mounting substrate directly or via at least one of the plurality of connection balls.

* * * * *